(12) United States Patent
Schwartz et al.

(10) Patent No.: US 11,242,148 B2
(45) Date of Patent: Feb. 8, 2022

(54) REPAIR AND REPLACEMENT MECHANISM FOR PERSONAL CONTROL UNITS ON AIRCRAFT

(71) Applicants: Mark Schwartz, Wauconda, IL (US); David Carhart, Cary, IL (US)

(72) Inventors: Mark Schwartz, Wauconda, IL (US); David Carhart, Cary, IL (US)

(73) Assignee: Astronics Connectivity Systems & Certification Co, Waukegan, IL (US)

(*) Notice: Subject to any disclaimer, the term of this patent is extended or adjusted under 35 U.S.C. 154(b) by 55 days.

(21) Appl. No.: 15/616,707

(22) Filed: Jun. 7, 2017

(65) Prior Publication Data

US 2018/0148173 A1    May 31, 2018

Related U.S. Application Data

(60) Provisional application No. 62/346,887, filed on Jun. 7, 2016.

(51) Int. Cl.

| | |
|---|---|
| *B64D 11/00* | (2006.01) |
| *H05K 7/12* | (2006.01) |
| *B60R 11/02* | (2006.01) |
| *B60R 11/00* | (2006.01) |

(52) U.S. Cl.
CPC ........ *B64D 11/00152* (2014.12); *B60R 11/02* (2013.01); *H05K 7/12* (2013.01); *B60R 2011/0015* (2013.01); *B60R 2011/0071* (2013.01)

(58) Field of Classification Search
CPC ......... B64D 11/00152; B64D 11/0015–00155; Y10T 29/4973; Y10T 29/49721; H05K 7/12; H05K 7/10; H05K 7/02; B60R 2011/0071; B60R 2011/0015; B60R 16/0207
USPC .............................. 29/762, 764, 763, 402.08
See application file for complete search history.

(56) References Cited

U.S. PATENT DOCUMENTS

| | | | | |
|---|---|---|---|---|
| 5,851,050 | A * | 12/1998 | Squire ..................... | E05F 15/49 296/146.4 |
| 6,463,773 | B1 * | 10/2002 | Dimig ..................... | E05B 83/36 292/201 |
| 6,827,026 | B2 * | 12/2004 | Williamson ....... | B64D 11/0696 108/44 |
| 8,225,458 | B1 * | 7/2012 | Hoffberg ................. | E05F 3/222 16/49 |
| 8,282,150 | B2 * | 10/2012 | Clor ....................... | B60N 2/305 296/65.09 |
| 9,403,596 | B2 * | 8/2016 | Pajic ...................... | H02J 7/027 |
| 9,548,617 | B2 * | 1/2017 | Toh ........................ | H02J 7/0044 |
| 10,087,665 | B2 * | 10/2018 | Gillen ................... | E05C 19/002 |
| 10,206,522 | B2 * | 2/2019 | Yang ...................... | A47F 3/002 |
| 2006/0075934 | A1 * | 4/2006 | Ram ................ | B64D 11/00155 108/44 |

(Continued)

*Primary Examiner* — Peter Dungba Vo
*Assistant Examiner* — Kaying Kue
(74) *Attorney, Agent, or Firm* — Vitale, Vickrey, Niro & Gasey LLP

(57) ABSTRACT

An assembly for opening or accessing an electronic communication and entertainment device holder for repair or replacement of its contents, including a latch which can be released by the contraction of an attached muscle wire actuator in response to a low current pulse sent by an attached wireless receiver.

1 Claim, 2 Drawing Sheets

(56) References Cited

U.S. PATENT DOCUMENTS

| | | | |
|---|---|---|---|
| 2007/0040109 A1* | 2/2007 | Schwartz | B60Q 1/245 |
| | | | 250/221 |
| 2008/0023600 A1* | 1/2008 | Perlman | B60K 37/06 |
| | | | 248/128 |
| 2008/0040756 A1* | 2/2008 | Perlman | B64D 11/00152 |
| | | | 725/75 |
| 2008/0127917 A1* | 6/2008 | Riley | F01L 1/185 |
| | | | 123/90.11 |
| 2010/0060050 A1* | 3/2010 | Muirhead | B64D 11/0015 |
| | | | 297/217.4 |
| 2010/0066151 A1* | 3/2010 | Usoro | B60R 22/03 |
| | | | 297/481 |
| 2013/0093220 A1* | 4/2013 | Pajic | G06F 1/1632 |
| | | | 297/163 |
| 2014/0306059 A1* | 10/2014 | Brown | B64D 11/00 |
| | | | 244/118.5 |
| 2016/0201655 A1* | 7/2016 | Laifenfeld | F03G 7/065 |
| | | | 318/117 |

\* cited by examiner

REPAIR AND REPLACEMENT MECHANISM FOR PERSONAL CONTROL UNITS ON AIRCRAFT

RELATED APPLICATIONS

This application claims priority to Provisional Application No. 62/346,887, filed Jun. 7, 2016.

FIELD OF INVENTION

The disclosure generally relates to a wireless actuated decoupling mechanism to enable placement, removal, repair and/or replacement of an electronic communication and entertainment device from a holder which de-coupled from the interior of the aircraft upon release of the latch. Specifically, the present invention entails receiving an actuation signal from a remote wireless unit and generating a low current pulse sent to a Nitinol or muscle wire actuator, wherein the shape of the actuator structure can be changed by heating the shape memory alloy to a transformation temperature, thus lifting or decoupling the latch that keeps the holder in a fixed (e.g., recessed) position in the back of the seat back of an aircraft seat or at the front of a seat pod in premium aircraft cabins.

BACKGROUND OF THE INVENTION

Seat back entertainment screens are significant investments for airlines and aircraft manufacturers. Because of the safety engineering that has to go into every part of a plane, the average in-flight entertainment screen can cost thousands of dollars per unit. As such, many airlines are choosing to configure or reconfigure their aircraft so that passengers can bring their own tablets or other viewing screens. Moreover, with an ever shrinking seat space for passengers, such passengers will still want a mechanism whereby they can use their own screens without taking up limited lap space. Furthermore, even when airlines elect to maintain their own screens, they need to be able to safely and quickly access such screens for repair and replacement when needed.

To date, however, there are no available products that permit wireless signals that can be used on board aircraft which actuate the release of electronic devices for quick replacement or repair, nor do any available devices provide a simple, wireless mechanism to allow a passenger to install his or her own screen in an available seat back holder.

What is needed is a system including the ability to remove, replace or insert a viewing screen without the need for specialized tools that might create security risks, and without requiring a more extensive disassembly of the holder or related support equipment.

DEFINITION OF TERMS

The following terms are used in the claims of the patent as filed and are intended to have their broadest plain and ordinary meaning consistent with the requirements of the law.

A muscle wire actuator is a low power, low profile mechanism for converting a electronic signal into a mechanical movement or contraction of a component.

A wireless receiver means any of several commercially available protocols for receiving commands for actuation, such as Bluetooth.

Where alternative meanings are possible, the broadest meaning is intended. All words used in the claims set forth below are intended to be used in the normal, customary usage of grammar and the English language.

Objects and Summary of the Disclosure

The apparatus and method of the present disclosure includes a wireless receiver for receiving an actuation signal from a remote unit (such as a nearby Bluetooth unit), and generating a low current pulse in response to such a signal. The wireless receiver can receive such a signal from a handheld electronic device (e.g., a service technician) or such a signal can come from a nearby button which generates a wireless signal specifically for actuating the holder. Regardless, the wireless receiver is connected to a Nitinol or muscle wire actuator which contracts in response to the low current pulse. A latch is coupled to the muscle wire actuator and is affixed to the frame of the holder such that it decouples when the muscle wire actuator contracts, thereby permitting the electronic communication and entertainment device holder to move from its normal, fixed attachment to the back of the seat or seat structure, such as the front of the first or business class seat pod upon release of the latch.

The immediate application of the present invention will be seen in aircraft application, but is transferable to other usage (e.g., buses, minivans, etc.) where quick and easy replacement of an electronic communication and entertainment device may be advantageous.

Thus can be seen that one object of the present invention is to provide a mechanism for replacing or repairing a video screen in a seat back holder.

A further object of the present invention is to provide a mechanism to allow a passenger easy placement of a personal electronic communication and entertainment device in a seat back.

Still another object of the present invention is to electronic communication and entertainment device holder that does not require specialized tools or knowledge for operation.

It should be noted that not every embodiment of the claimed invention will accomplish each of the objects of the invention set forth above. In addition, further objects of the invention will become apparent based on the summary of the invention, the detailed description of preferred embodiments, and as illustrated in the accompanying drawings. Such objects, features, and advantages of the present invention will become more apparent in light of the following detailed description various embodiments thereof, and as illustrated in the accompanying drawings.

DETAILED DESCRIPTION OF THE INVENTION

Set forth below is a description of what is currently believed to be the preferred embodiment or best examples of the invention claimed. Future and present alternatives and modifications to this preferred embodiment are contemplated. Any alternatives or modifications which make insubstantial changes in function, in purpose, in structure or in result are intended to be covered by the claims in this patent.

Figure 1:
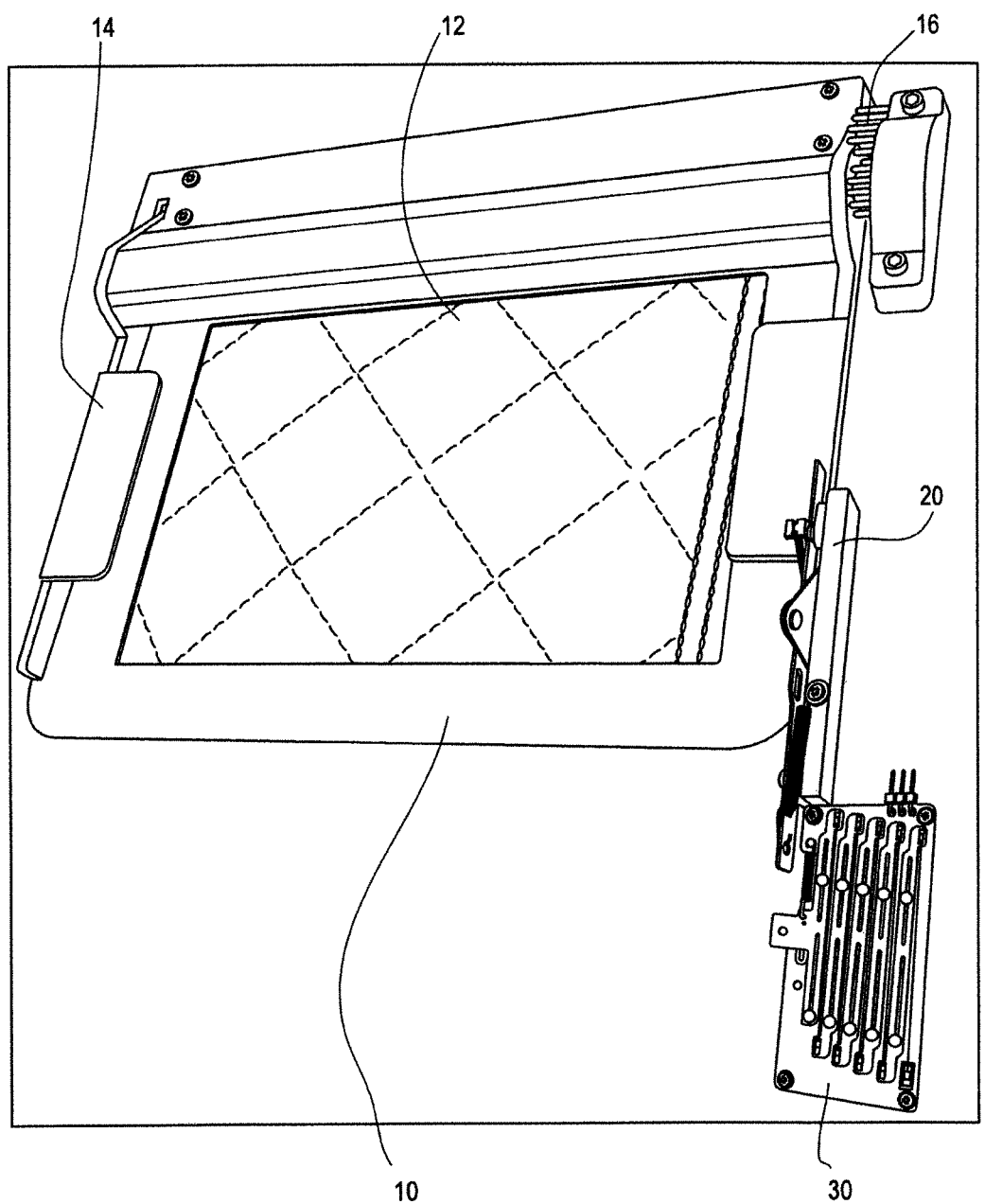
FIG. 1 shows back view of a holder with the latch and muscle wire actuator features in accord with a preferred embodiment of the present invention.

FIG. 1 shows an example of an electronic communication and entertainment device holder 10 in accord with the present invention. The holder 10 includes a window 12 for viewing the electronic communication and entertainment device therethrough, a lip 14 for extending behind any electronic communication and entertainment device contained in the holder 10 and defining a slot in the holder 10 for receiving the electronic communication and entertainment device, and a hinge 16 for pulling the holder forward to remove, replace or insert a electronic communication and entertainment device therein as needed.

Figure 2:
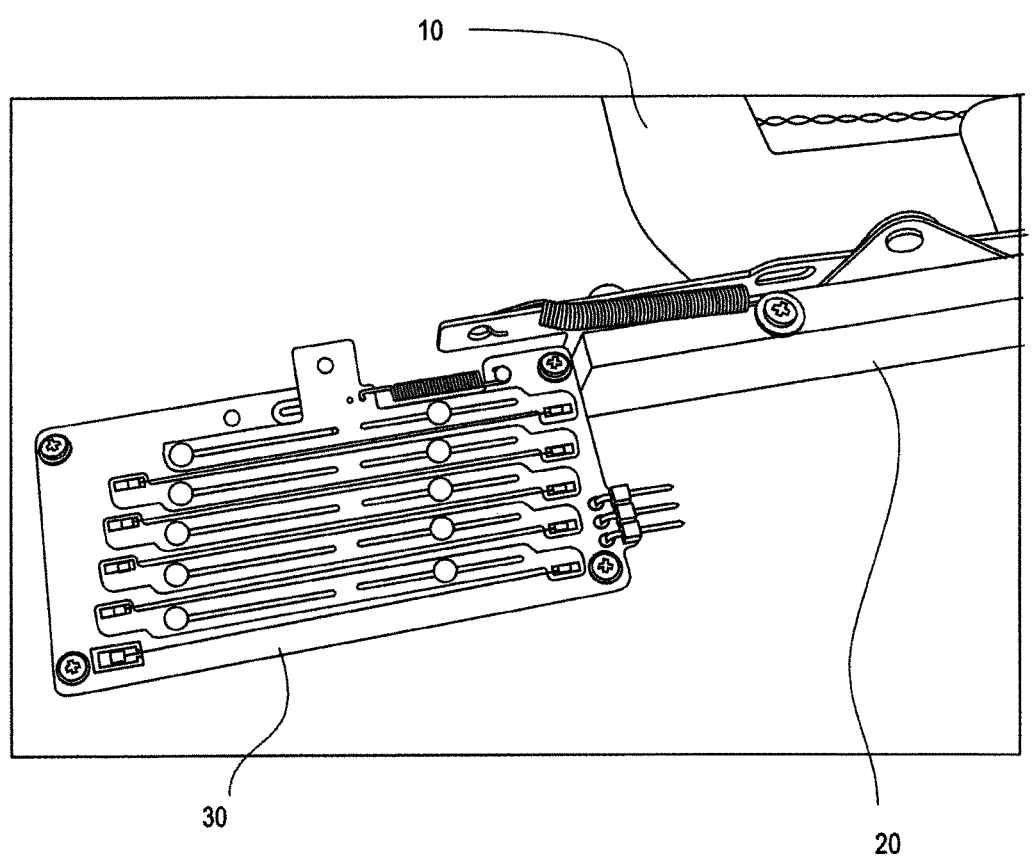
FIG. 2 shows a detail of the latch and muscle wire actuator features of in accord with a preferred embodiment of the present invention.

As shown in FIGS. 1 and 2, the holder has attached thereto a latch 20, with is further attached to a muscle wire actuator 30. Muscle wire (also known as Nitinol Wire or 'Memory Wire') is a special shape memory alloy composed primarily of Nickel (Ni) and Titanium (Ti). The muscle wire actuator will shorten in length after receiving an electrical signal (through an attached wireless receiver 40 (not shown), or heated by other means. Nitinol wire returns to its original length the electrical signal is removed and/or cooled. The attached wireless receiver, in turn, can receive an actuation signal from a variety of sources, such as a nearby button 50 (not shown) which generates a Bluetooth or similarly publicly available protocol signal. Alternatively, the actuation signal could come from a separate handheld device, such as a phone or tablet. In either event the actuation signal causes the wireless receiver 40 to generate a low power signal which, in turn, heats the muscle wire actuator 30, causing it to contract and lift latch 20, thus freeing the holder 10 to be pulled down for placement or replacement of an electronic communication and entertainment device therein.

The above description is not intended to limit the meaning of the words used in the following claims that define the invention. Rather, it is contemplated that future modifications in structure, function or result will exist that are not substantial changes and that all such insubstantial changes in what is claimed are intended to be covered by the claims. For instance, the specific muscle wire actuator in the examples of the preferred embodiments of present invention is for illustrative purposes with reference to the example drawings only. Also, while the present preferred embodiment deals with aircraft, the invention is equally applicable to non-aircraft and non-vehicle applications, too. Furthermore, the way in which the holder decouples from the seat back can involve any variety of displacement, not just the bottom hinge "tilt forward" mechanism disclosed above. Likewise, it will be appreciated by those skilled in the art that various changes, additions, omissions, and modifications can be made to the illustrated embodiments without departing from the spirit of the present invention. All such modifications and changes are intended to be covered by the following claims.

What is claimed is:

1. A mechanism for a placement, removal, repair and replacement of an electronic communication and entertainment device attached to the interior of an aircraft, the electronic communication and entertainment device having a first position whereby the electronic communication and entertainment device is operated by a wireless remote unit from a passenger, and a second position whereby the electronic communication and entertainment device is detaching from the interior of the aircraft, wherein movement of the electronic communication and entertainment device to the second position is operated by a separate handheld unit from a service technician for the placement, removal, repair and replacement of the electronic communication and entertainment device, the mechanism comprising;
   a) a wireless receiver for receiving an actuation signal from the wireless remote unit operated by the passenger and the separate handheld unit operated by the service technician, said wireless receiver generating a low current pulse therefrom, the low current pulse having heat associated therewith;
   b) a muscle wire actuator for receiving the heat from the low current pulse and contracting the muscle wire actuator in response thereto;
   c} latch connected to the muscle wire actuator, releasing the latch in response to the contracting of the muscle wire actuator; and
   d) an electron communication and entertainment device holder and the electronic communication and entertainment device are decoupling to completely detach and separate from the interior of the aircraft upon the releasing of the latch.

* * * * *

UNITED STATES PATENT AND TRADEMARK OFFICE
CERTIFICATE OF CORRECTION

PATENT NO. : 11,242,148 B2
APPLICATION NO. : 15/616707
DATED : February 8, 2022
INVENTOR(S) : Mark Schwartz et al.

Page 1 of 1

It is certified that error appears in the above-identified patent and that said Letters Patent is hereby corrected as shown below:

In the Claims

Claim 1, Column 4, Line 34: "c} latch" should read --c) a latch--
Claim 1, Column 4, Line 37: "an electron communication" should read --an electronic communication--

Signed and Sealed this
Fifteenth Day of March, 2022

Drew Hirshfeld
*Performing the Functions and Duties of the*
*Under Secretary of Commerce for Intellectual Property and*
*Director of the United States Patent and Trademark Office*